(12) United States Patent
Yamamoto

(10) Patent No.: US 6,300,784 B1
(45) Date of Patent: Oct. 9, 2001

(54) IC SOCKET

(75) Inventor: Takeshi Yamamoto, Urawa (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 09/466,572

(22) Filed: Dec. 17, 1999

(30) Foreign Application Priority Data

Dec. 25, 1998 (JP) ................................................. 10-376832

(51) Int. Cl.⁷ ................................................... G01R 31/02
(52) U.S. Cl. ............................. 324/762; 324/754; 439/68
(58) Field of Search ................................... 324/765, 755, 324/754, 762; 439/65, 68, 70, 72, 73, 66, 525, 266

(56) References Cited

U.S. PATENT DOCUMENTS 5,626,481 * 5/1997 Abe ......................................... 439/73

FOREIGN PATENT DOCUMENTS 10376832  12/1998 (JP).

* cited by examiner

Primary Examiner—Safet Metjahic
Assistant Examiner—Etienne LeRoux
(74) Attorney, Agent, or Firm—Bachman & LaPointe, P.C.

(57) ABSTRACT

There is provided an IC socket, which can peel out oxide films covering the surface of a terminal of IC and that of a wiring, and which can reduce inductance components. A first inclined side of a contact pin comes in contact with an actuating portion of a press lever, a second inclined side thereof comes in contact with rubber, and an engaging portion of the contact pin is supported by a contact pin support member. In a state in which contact portions of the contact pin come in contact with a terminal of IC and a wiring, if the first inclined side of the contact pin is further pressed by an actuating portion of the press lever, the contact pin deforms rubber and moves as rubbing the terminal of IC and the wiring. Thus, since the rubber is elastically deformed, there is no need to deform the contact pin itself elastically, so that the contact pin can be downsized.

7 Claims, 9 Drawing Sheets

IC SOCKET

BACKGROUND OF THE INVENTION

1. Field of the Invention

The present invention relates to an IC socket for use in an electrical test of an IC, and particularly to an IC socket, which is capable of testing a high frequency characteristic of the IC.

2. Description of the Related Art

Conventionally, various IC sockets have been invented to test a high frequency characteristic of an IC. For example, in an IC socket 50 shown in FIG. 17, a contact pin 54 is brought into contact with a terminal 52a of an IC 52 mounted on a substrate 51 and a wiring 53 formed on a substrate 51 in such a manner that the contact pin 54 mounts over the terminal 52a and the wiring 53. Then, the terminal 52a of IC 52 and the wiring 53 are electrically connected to each other through the contact pin 54 so as to test the frequency characteristic of IC 52. The contact pin 54 is rotatably attached to a tip of an arc spring member 56 whose one end is fixed to a cover 55. Then, the contact pin 54 is pressed to the terminal 52a of IC 52 and the wiring 53 by the spring force of the spring member 56, which elastically deforms between the descending cover 55 and the contact pin 54.

The above-structured IC socket 50 can establish an electric connection between the terminal 52a of IC 52 and the wiring 53 through the small contact pin 54, and shorten the connection distance between the terminal 52a of IC 52 and the wiring 53, allowing inductance components to be reduced (Unexamined Japanese Patent Publication Hei No. 9-74156).

However, the IC socket 50 only presses the contact pin 54 to the terminal 52a of IC 52 and the wiring 53 and it is not structured such that the surface of the terminal 52a is rubbed by the contact pin 54. As a result, such a possibility was pointed out that a natural oxide film, which covers the surface of the terminal 52a, was not be surely peeled.

As shown in FIG. 18, there is proposed an IC socket 58 set forth below (Unexamined Japanese Patent Publication Hei No. 9-74156). Namely, substantially the central portion of an arc-shape contact pin 57, which is elastically deformable, is fixed to the cover 55, and both end portions 57a and 57b of contact pin 57 are pressed to the terminal 52a of IC 52 and the wiring 53, respectively. This allows the natural oxide film, which covers the surface of the terminal 52a, to be rubbed and makes it possible to establish an electric connection between the terminal 52a of IC 52 and the wiring 53 through the contact pin 57. However, in such a structure in which contact pin 57 as such is elastically deformed, since rigidity of the contact pin 57 must be retained, the downsizing of IC socket can be sufficiently improved. As a result, such a problem was pointed out that inductance components were not fully reduced.

SUMMARY OF THE INVENTION

It is an object of the present invention is to provide an IC socket, which can rub a surface of an IC terminal with a contact pin and which can reduce inductance components.

The invention of the first aspect is an IC socket, which comprises a contact pin, which has contact portions coming in contact with a terminal of an IC mounted on an IC support portion and a wiring formed on a substrate in such a manner that the contact pin mounts over the terminal and the wiring, and which electrically connects the terminal of IC to the wiring, and a press member for pressing the contact pin to the terminal and the wiring. Then, the contact pin has a first inclined side and a second inclined side crossing each other. Also, the press member has an actuating portion, which comes in contact with the first inclined side, and an elastic member, which comes in contact with the second inclined side. Then, the contact pin is supported by a contact pin support member attached to the press member such that the contact pin can move on the terminal and the wiring by deforming the elastic member by an inclined surface component force, which acts on the first inclined side, when the contact pin is pressed onto the terminal and wiring by the actuating portion.

The invention of the second aspect is that, in the invention of the first aspect, the elastic member is a metal-made elastic member, which is attached to the press member in a one-side beam form, and an insulating member is fixed to an contact portion with the contact pin.

The invention of the third aspect is that, in the invention of the first aspect, the contact pin support member is engaged with an engaging portion, which is formed at a lower side of a contact portion between the terminal of the contact pin and the wiring.

The invention of the fourth aspect is that, in the invention of the first aspect, the contact pin support member is fitted to a hole, which is formed on the contact pin, to generate a space.

The invention of the fifth aspect is an IC socket, which comprises a contact pin, which has contact portions coming in contact with a terminal of an IC mounted on an IC support portion and a wiring formed on a substrate in such a manner that the contact pin mounts over the terminal and the wiring, and which electrically connects the terminal of IC to the wiring, and a press member for pressing the contact pin to the terminal and the wiring. Then, the contact pin has a first inclined side and a second inclined side crossing each other. Also, the press member has an actuating portion, which comes in contact with the first inclined side and an elastic member, which comes in contact with the second inclined side. Then, the contact pin has a step portion, which is supported by the actuating portion of the press member, such that the contact pin can move on the terminal and the wiring by deforming the elastic member by an inclined surface component force, which acts on the first inclined side, when the contact pin is pressed onto the terminal and wiring by the actuating portion.

The invention of the sixth aspect is an IC socket, which comprises a contact pin, which has contact portions coming in contact with a terminal of an IC mounted on an IC support portion and a wiring formed on a substrate in such a manner that the contact pin mounts over the terminal and the wiring, and which electrically connects the terminal of IC to the wiring, and a press member for pressing the contact pin to the terminal and the wiring. Also, the contact pin has a first inclined side and a second inclined side crossing each other, the press member has an actuating portion, which comes in contact with the first inclined side and an elastic member, which comes in contact with the second inclined side. Then, the contact pin is urged to the actuating portion and the elastic member by elastic support means, which is attached to a socket main body, such that the contact pin can move on the terminal and the wiring by deforming the elastic member by an inclined surface component force, which acts on the first inclined side, when the contact pin is pressed onto the terminal and wiring by the actuating portion.

The invention of the seventh aspect is an IC socket, which comprises a contact pin, which has contact portions coming in contact with a terminal of an IC mounted on an IC support portion and a wiring formed on a substrate in such a manner that the contact pin mounts over the terminal and the wiring, and which electrically connects the terminal of IC to the wiring, a press lever for pressing the contact pin to the terminal and the wiring, an operation lever for locking the press lever at a predetermined position where the contact pin comes in contact with the terminal and the wiring, a socket main body for rotatably supporting the press lever and the operation lever, a first spring for always rotating and urging the press lever in a direction where a contact state among the contact pin, the terminal and the wiring is released, and a second spring for always rotating and urging the operation lever in a direction, which is opposite to the urging direction of the first spring. Then, a first cam is formed at the press lever, while a second cam, which opposes the first cam, is formed at the operation lever, when the press lever is rotated to a predetermined position where the contact pin is pressed, the first cam and the second cam are meshed with each other by spring force of the first spring and the second spring so that the press lever is locked by the operation lever. Also, when the operation lever is rotated in a direction, which is opposite to the urging direction of the second spring, the mesh between the first cam and the second cam is released, and the press lever is rotated in a direction where the press lever separates from the predetermined position, by the first spring.

In the invention of the first aspect, the contact pin has the first inclined side and the second inclined side crossing each other, and the first inclined side is pressed by the press lever, and the second inclined side is pressed by the elastic member. For this reason, under the state that the contact portion of contact pin comes in contact with the terminal of IC and the wiring, when the first inclined side of contact pin is pressed by the actuating portion of the press lever, the contact pin deforms the elastic member and moves as rubbing the terminal of IC and the wiring. This allows the contact portions of contact pin to peel out the natural oxide film, which covers the surface of the terminal of IC, and the natural oxide film, which covers the wiring. Therefore, in the IC socket of the present invention, the terminal of IC and the wiring can be electrically connected to each other through the contact pin without fail, so that the electrical test of IC can be carried out without fail. Also, in the IC socket of the present invention, when the first inclined side of contact pin is pressed by the actuating portion of the press lever, the second inclined side elastically deforms the elastic member, and the contact pin is pressed to the terminal of IC and the wiring by the elastic force of the elastic member. This eliminates the need for elastically deforming the contact pin itself, with the result that rigidity of the contact pin can be sufficiently ensured. Therefore, according to the IC socket of the present invention, the downsizing of contact pin can be fully improved without being subject to the limitation due to the elasticity of contact pin itself and its rigidity, and inductance components can be reduced. As a result, according to the IC socket of this embodiment, it is possible to measure the high frequency characteristic of IC with high accuracy.

In the invention of the second aspect, since the contact pin is structured to be pressed by the metal-made elastic member, excellent durability is exerted under an environment where heat resistance is required. Also, the insulating member is fixed to the contact pin of the metal-made elastic member and the contact portions, allowing the electrical test of IC to be carried out correctly without losing the electrical characteristic of contact pin.

In the invention of the third aspect, the first inclined side of contact pin comes in contact with the actuating portion, the second inclined side of the contact pin comes in contact with the elastic member, and the lower side of contact pin is supported by the contact pin support member. For this reason, three points of the contact pin are supported by the press member, so that the contact pin is brought into contact with the terminal and the wiring and separated therefrom with the movement of the press member.

In the invention of the fourth aspect, the contact pin support member and the hole of contact pin are fitted to each other to generate a space. For this reason, if the first inclined side of contact pin is pressed by the actuating portion, the contact pin deforms the elastic member elastically, and moves as rubbing the terminal of IC and the wiring of the substrate, so that the natural oxide films, which cover the surface of the terminal and that of the wiring, are peeled out and the terminal and the wiring can be electrically connected to each other through the contact pin without fail. Also, according to the present invention, since the engaging portion between the contact pin support member and the contact pin is formed between the contact portions, it is possible to form the contact portions to be close to each other, and the connection path between the terminal and the wiring can be shortened. As a result, the IC socket of the present invention makes it possible to reduce the inductance components of contact pin, and to measure the high frequency characteristic of IC more accurately.

In the invention of the fifth aspect, the first inclined side of contact pin is brought into contact with the actuating portion of the press member and the second inclined side of contact pin is brought into contact with the elastic member, and the step portion of contact pin is engaged with the actuating portion of the press member. This allows the contact pin to be supported to be relatively movable to the press member. Since this is not the structure in which the contact pin support member is engaged with the place between the contact portions of contact pin, the connection path between the terminal and the wiring can be shortened. As a result, the IC socket of the present invention makes it possible to reduce the inductance components of contact pin, and to measure the high frequency characteristic of IC more accurately.

In the invention of the sixth aspect, the contact pin is structured such that the contact pin is pressed to the actuating portion of press member and the elastic member by elastic support member attached to the socket main body without attaching the contact pin support member to the press member. For this reason, the same effect as that of the invention of the first aspect, and the structure of press member can be simplified.

DETAILED DESCRIPTION OF THE PREFERRED EMBODIMENTS

Embodiments of the present invention will be described with reference to drawings accompanying herewith.
(First Embodiment)

Figure 1:
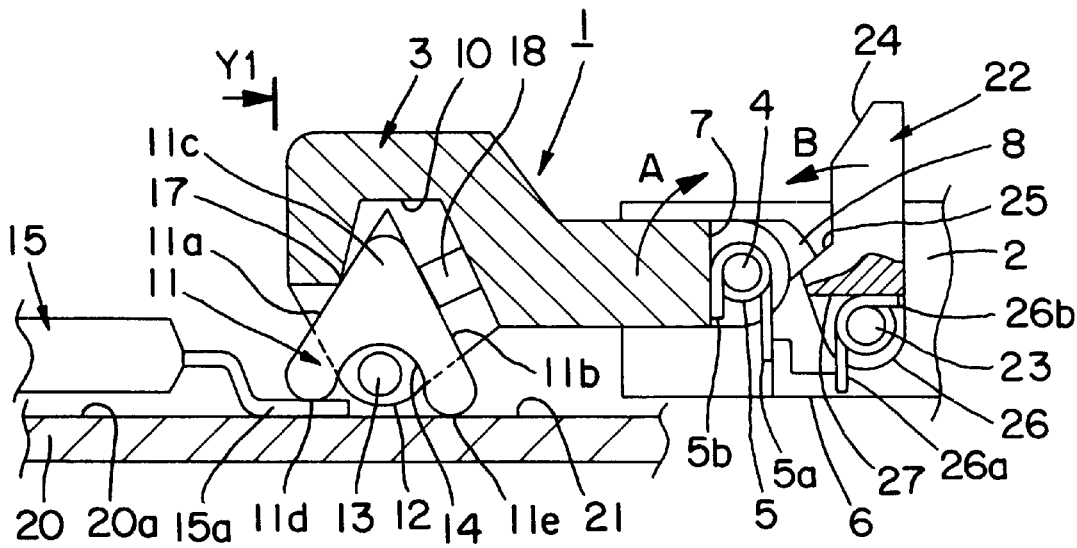
FIG. 1 is a cross sectional view showing main parts of an IC socket according to a first embodiment of the present invention.
Figure 2:
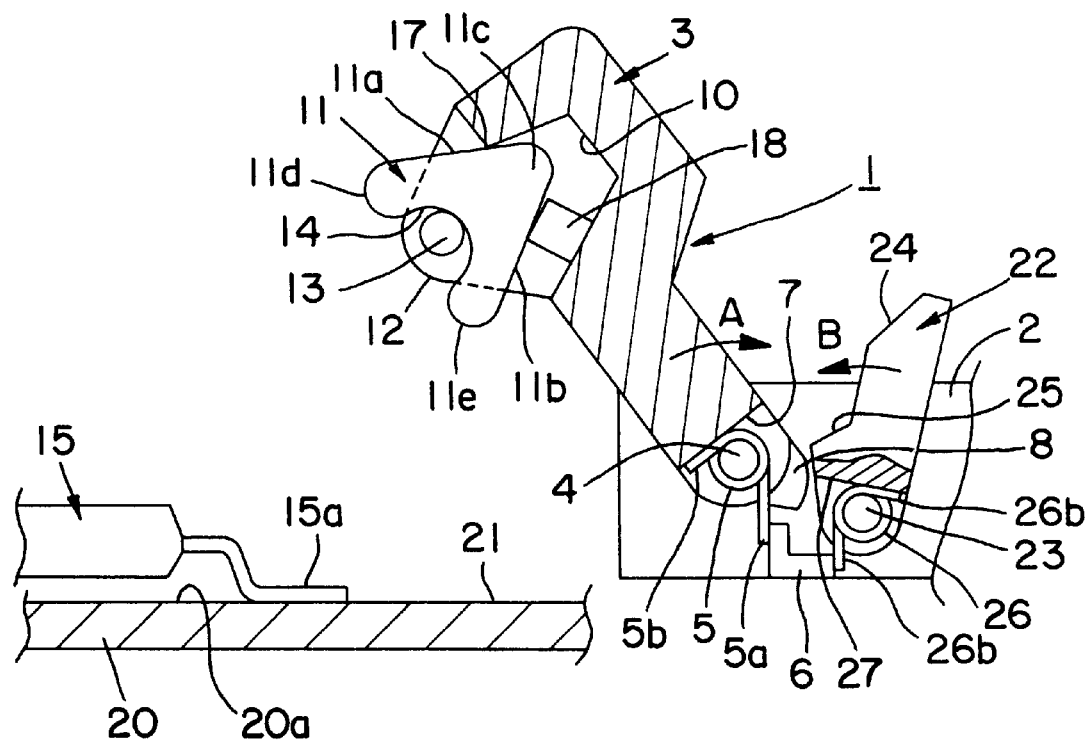
FIG. 2 is a view showing an actuation state of the IC socket of FIG. 1.
Figure 9:
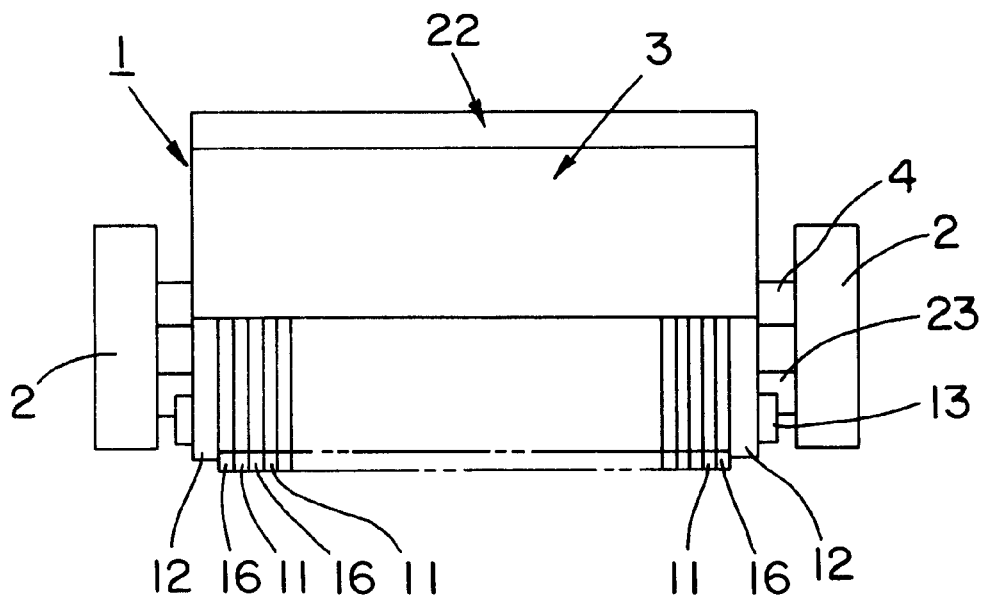
FIG. 9 is a left side view (view in a direction of Y1) of the IC socket of FIG. 1.

FIGS. 1 and 2 show an IC socket 1 according to a first embodiment of the present invention. As shown in these figures, the IC socket 1 of this embodiment is attached to a socket main body 2 such that a press lever (press member) 3 can be rotated through a shaft 4 (FIG. 9). Then, this press lever 3 is always urged clockwise (direction A in the figure) by a spring 5 (first spring) fitted to the shaft 4. In the spring 5, one end 5a thereof comes in contact with a spring support portion 6 formed on the socket body 2 and other end 5b comes in contact with a notch portion 7 of the press lever 3. Also, a first cam 8, which is substantially arc-shaped, is formed at one end side of this press lever 3 (right end portion in FIG. 1).

A contact pin containing portion 10 is formed at the other end side of the press lever 3 (left end portion in FIG. 1). Then, in this contact pin containing portion 10, a top portion 11c of a contact pin 11 having a first inclined side 11a and a second inclined side 11b, which are formed to cross each other, is contained.

As shown in FIG. 9, side walls 12 are formed at both side ends of press lever 3, respectively, and a rod-shaped contact pin support member 13 is stretched to these side walls 12 and 12. Then, as shown in FIG. 1, the contact pin support member 13 is engaged with an arc-shaped engaging portion 14, which is formed at a lower side of the contact pin 11. It should be noted that a plurality of contact pins 11 are contained between the side walls 12 and 12 through an insulating member 16 to correspond to a terminal 15a of an IC (TSOP, QFP, etc) 15.

Also, as shown in FIG. 1, an actuating portion 17, which comes in contact with the first inclined side 11a of contact pin 11, is formed in the contact pin containing portion 10 of press lever 3. Also, elastically deformable rubber (elastic member) 18, which comes in contact with the second inclined side 11b of contact pin 11, is attached thereto. As shown in FIG. 2, when the press lever 3 rotates in a direction separating from the IC 15 (clockwise direction in FIG. 2 (direction A)), three points of the contact pin 11 are supported by the actuating portion 17, contact pin support member 13, and rubber 13, and the contact pin 11 rotates together with the press lever 3.

Figure 11:
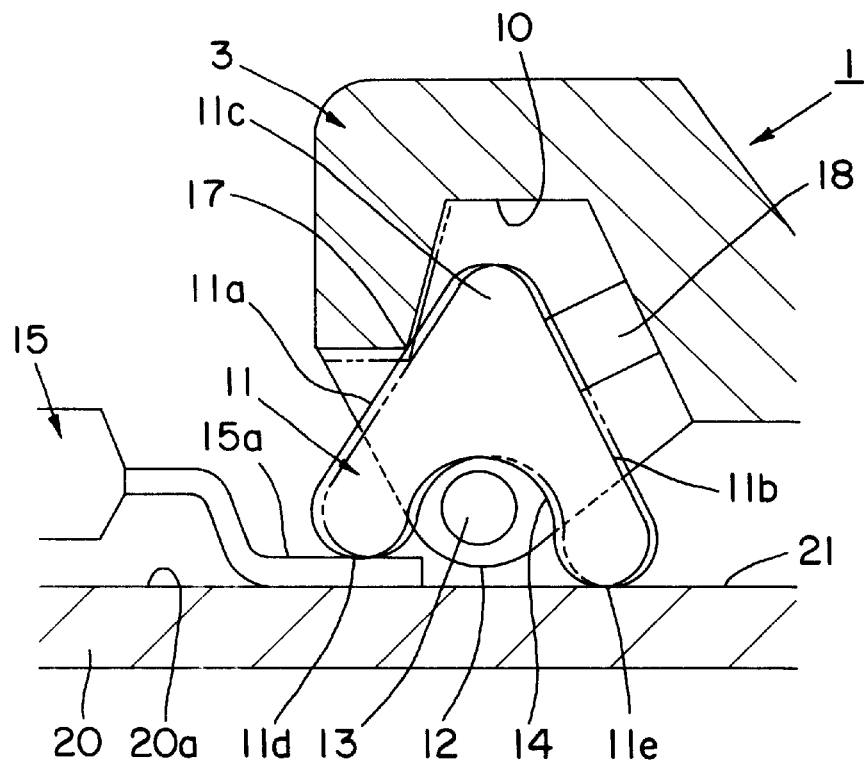
FIG. 11 is a view showing a displacement state of the contact pin.

It should be noted that the contact pin 11 is formed to generate a predetermined space between the engaging portion 14 and the contact support member 13 at the position where the contact pin 11 mounts over the terminal 15a of IC 15 and a wiring 21 of a substrate 20 and comes in contact therewith. The predetermined space herein is such that the contact pin 11 can slide on the terminal 15a of IC 15 and the wiring 21 when the first inclined side 11a of contact pin 11 is pressed by the actuating portion 17 (FIG. 11). In the contact pin 11, contact portions 11d and 11e between the terminal 15a of IC 15 and the wiring 21 are arc-shaped.

Also, in FIG. 1, an operation lever 22 is positioned at the right side of press lever 3 in the figure. This operation lever 22 is attached to the socket main body 2 to be rotatable through a shaft 23, and a cam surface 24 is formed on its tip. Moreover, a second cam 25, which is engaged with the first cam 8 of the press lever 3, is formed at the side portion of the shaft 23 of the operation lever 22. Then, this operation lever 22 is always urged anticlockwise (direction B in the figure) by a spring 26 (second spring) fitted to the shaft 23. Therefore, if the press lever 3 rotates to the position of FIG. 1 from the position of FIG. 2, the first cam 8 of press lever 3 and the second cam 25 of the operation lever 22 are meshed with each other by the spring force of springs 5 and 25. As a result, the press lever 3 is locked in a state in which the contact pin 11 is pressed to the terminal 15a of IC 15 and the wiring 21. In the spring 26, one end 26a comes in contact with the spring support portion 6 formed on the socket body 2 and other end 26b comes in contact with a notch portion 27 of the operation lever 22.

In the above-structured IC socket 1 of this embodiment, IC 15 is mounted on an IC support portion 20a of the substrate 20 in a state in which the press lever 3 of FIG. 2 is opened. Next, if the press lever 3 is rotated anticlockwise from the position of FIG. 2 to the position of a solid lined of FIG. 1, the contact portions 11d and 11e of contact pin 11 come in contact with the terminal 15a of IC 15 and the wiring 21, respectively. Thereafter, if the press lever 3 further rotates to the position of a two-dotted chain line, the first inclined side 11a of contact pin 11 is pressed by the actuating portion 17 of press lever 3 and the second inclined side 11b of contact pin 11 presses rubber 18 to be elastically deformed. As a result, the contact pin 11 moves to the position of the two-dotted line as rubbing the terminal 15a of IC 15 and the wiring 21. In this case, a natural oxide film, which covers the surface of the terminal 15a of IC 15, and a natural oxide film, which covers the surface of the wiring 21, are peeled out without fail, with the result that the terminal 15a of IC 15 and the wiring 21 are electrically connected to each other through the contact pin 11 without fail.

If the press lever 3 rotates to the position of the two-dotted line of FIG. 11, the second cam 25 of operation lever 22, which has been urged by the spring 26, is meshed with the first cam 8 of the press lever 3, and the press lever 3 is locked by the operation lever 22 (FIG. 1). Under this state, an electrical test such as high frequency characteristic of IC 15 is performed. After ending the electrical test of IC 15, the operation lever 22 is rotated clockwise in FIG. 1 and the mesh between the first cam 8 of the press lever 3 and the second cam 25 of the operation lever 22 is released. Whereby, the press lever 3 is rotated clockwise (direction A) in FIG. 1 by the spring force of spring 5, and the contact pin 11 is separated from the terminal 15a of IC 15 and the wiring 21, and rotated to the position of FIG. 2. Under the state of FIG. 2, the IC 15 is taken out of the substrate 20.

As mentioned above, according to this embodiment, the contact pin 11 has the first inclined side 11a and the second inclined side 11b, which are formed to cross each other. The first inclined side 11a is pressed by the actuating portion 17 of press lever 3 and the second inclined side 11b is pressed by the rubber 18. For this reason, if the first inclined side 11a of contact pin 11 is further pressed by the actuating portion 17 of press lever 3 in the state that the contact portions 11d and 11e of contact pin 11 come in contact with the terminal 15a of IC 15 and the wiring 21, the contact pin 11 deforms the rubber 18 and moves as rubbing the terminal 15a of IC 15 and the wiring 21. This allows the contact portions 11d and 11e of contact pin 11 to peel out the natural oxide film, which covers the surface of the terminal 15a of IC 15, and the natural oxide film, which covers the surface of the wiring 21. Therefore, the terminal 15a of IC 15 and the wiring 21 are electrically connected to each other through the contact pin 11 without fail, and the electrical test of IC 15 can be surely carried out.

Moreover, according to this embodiment, if the first inclined side 11a of contact pin 11 is pressed by the actuating portion 17 of press lever 3, the second inclined side 11b of contact pin 11 elastically deforms the rubber 18 and the contact pin 11 is pressed to the terminal 15a of IC 15 and the wiring 21 by the elastic force of rubber 18. For this reason, there is no need to elastically deform the contact pin itself, so that rigidity of the contact pin 11 can be sufficiently ensured. Therefore, according to the IC socket 1 of this embodiment, the downsizing of contact pin 11 can be fully improved without being subject to the limitation due to the elasticity of the contact pin 11 itself and its rigidity. This also allows inductance components to be reduced. As a result, according to the IC socket of this embodiment, it is possible to measure the high frequency characteristic of IC 15 with high accuracy.

(Second Embodiment)

Figure 3:
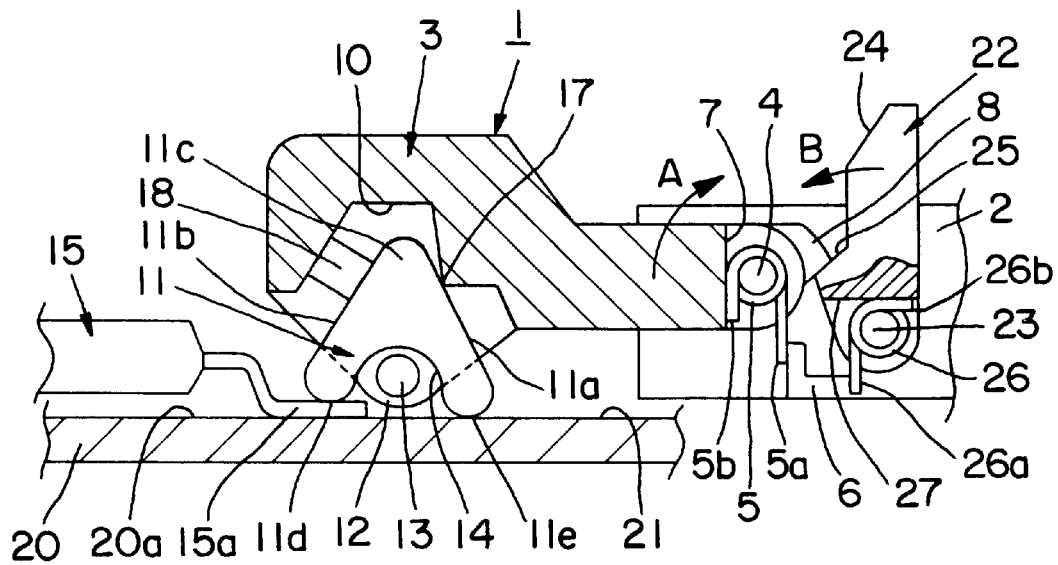
FIG. 3 is a cross sectional view showing main parts of an IC socket according to a second embodiment of the present invention.

FIG. 3 is an IC socket showing a second embodiment of the present invention. The same reference numerals as those of the first embodiment are added to the structure common to the first embodiment, and the explanation thereof will be given as omitting the explanation overlapping with the first embodiment.

In the IC socket 1 of this embodiment, the first inclined side 11a of contact pin 11 is an inclined side of the right side of the figure. This first inclined side 11a is pressed by the actuating portion 17 formed on the press lever 3. The second inclined side 11b of contact pin 11 is an inclined side of the left side of the figure. This second inclined side 11b is pressed by the rubber 18.

Therefore, according to this embodiment, if the contact pin 11 is pressed by the actuating portion 17, the contact pin 11 deforms the rubber 18 elastically and moves in the left direction in the figure as rubbing the terminal 15a of IC and the wiring 21 of substrate 20. As a result, the contact portions 11d and 11e of contact pin 11 peel out the natural oxide film, which covers the surface of the terminal 15a of IC 15, and the natural oxide film, which covers the surface of the wiring 21. Then, the terminal 15a of IC 15 and the wiring 21 on the substrate 20 can be electrically connected to each other through the contact pin 11 without fail. As a result, this embodiment can obtain the same effect as that of the first embodiment.

(Third Embodiment)

Figure 4:
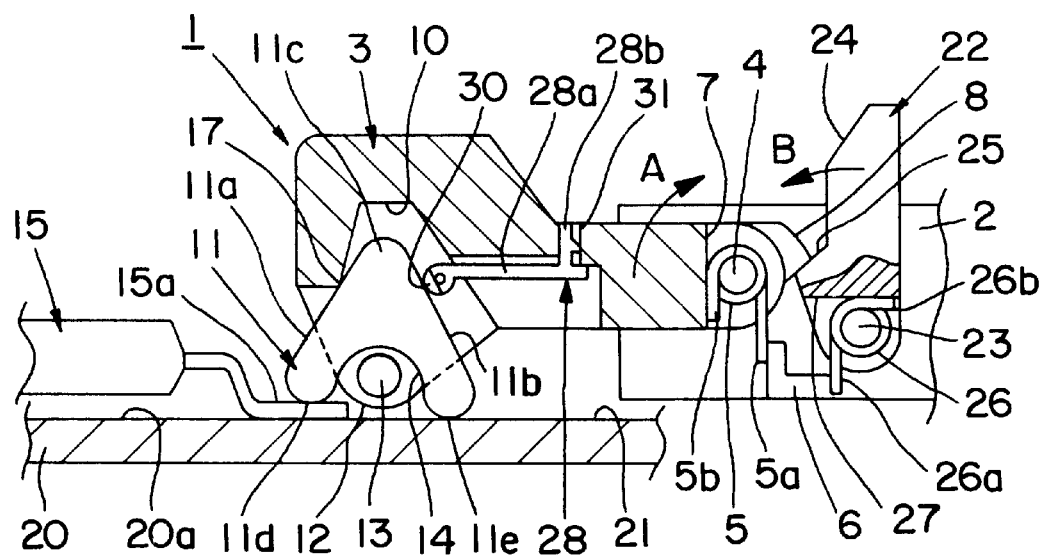
FIG. 4 is a cross sectional view showing main parts of an IC socket according to a third embodiment of the present invention.

FIG. 4 is an IC socket showing a third embodiment of the present invention. The same reference numerals as those of the first embodiment are added to the structure common to the first embodiment, and the explanation thereof will be given as omitting the explanation overlapping with the first embodiment.

The IC socket 1 of this embodiment shows a specific form in which a metal-made elastic member 28 is used in place of the rubber 8 of the first embodiment. In the metal-made elastic member 28, insulating resin (insulating member) 30 is fixed to the contact portion with the contact pin 11, and an engaging piece 28b of a base 28a is pressurized to an attaching hole 31 of the press lever 3. Then, the metal-made elastic member 28 is supported by the press lever 3 in a one-side beam form. If the metal-made elastic member 28 is pressed by the contact pin 11, the elastic member 28 is elastically deformed so that the second inclined side 11b of contact pin 11 is acted upon by an elastic force, thereby pressing the contact pin 11 to the terminal 15a of IC 15 and the wiring 21 of substrate 20.

As mentioned above, if the metal-made elastic member 28 is pressed by the contact pin 11, the elastic member 28 is elastically deformed. For this reason, if the first inclined side 11a of contact pin 11 is pressed by the actuating portion 17 of lever 3, the first inclined side 11a is elastically deformed so as to permit the movement of contact pin 11. Therefore, the contact pin 11 moves as rubbing the terminal 15a of IC 15 and the wiring 21 of substrate 20.

As a result, in the IC socket 1 of this embodiment, the contact pin 11 peels out the natural oxide film, which covers the surface of the terminal 15a of IC 15, and the natural oxide film, which covers the surface of the wiring 21. Then, the terminal 15a of IC 15 and the wiring 21 are electrically connected to each other through the contact pin 11 without fail, and the same effect as that of the first embodiment can be obtained.

According to this embodiment, since the metal-made elastic member 28 is used in place of the rubber 8 of the first embodiment, heat resistance is improved.

Figure 5:
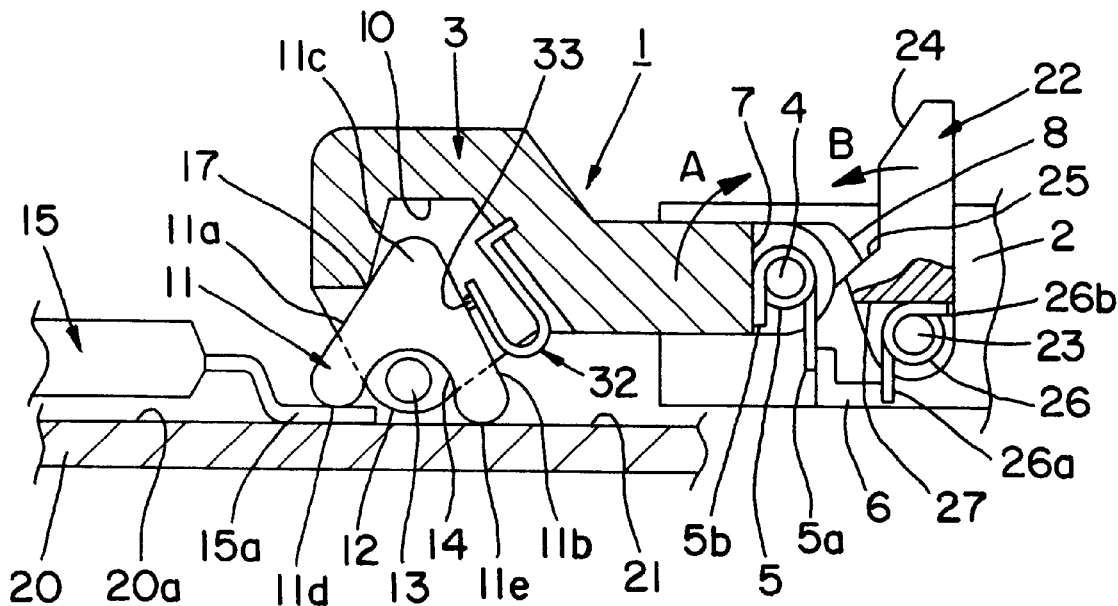
FIG. 5 is a cross sectional view of main parts of the IC socket showing an application example of the IC socket according to the third embodiment of the present invention.

The metal-made elastic member 28 is not limited to one used in this embodiment. Any member may be used if the member can support the second inclined side 11b of contact pin 11 elastically and permit the movement of contact pin 11. For example, a U-shaped spring member 32 as shown in FIG. 5 may be used. It should be noted that an insulating member 33 is also fixed to the contact portion with the contact pin 11 of the spring member 32 of FIG. 5.

(Fourth Embodiment)

Figure 6:
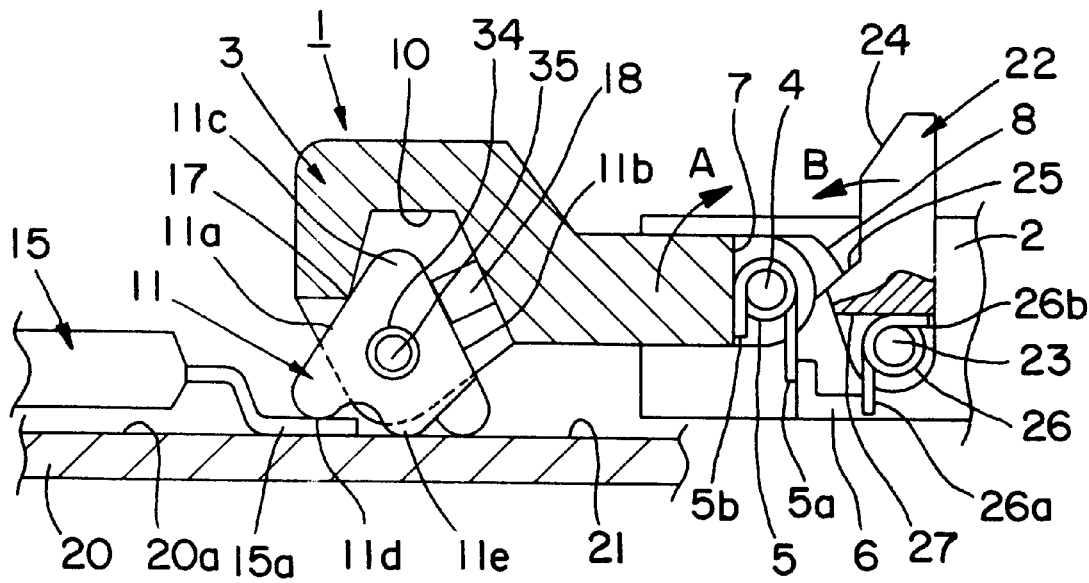
FIG. 6 is a cross sectional view showing main parts of an IC socket according to a fourth embodiment of the present invention.

FIG. 6 is an IC socket showing a fourth embodiment of the present invention. The same reference numerals as those of the first embodiment are added to the structure common to the first embodiment, and the explanation thereof will be given as omitting the explanation overlapping with the first embodiment.

In the IC socket 1 of this embodiment, a hole 34 is formed on the contact pin 11, and a contact pin support member 35, which has a diameter smaller than the hole diameter of the hole 34, is fitted to the hole 34. Then, the contact pin 11 is supported by the actuation 17 of press lever 3, rubber 18, and contact pin support member 35.

According to the above-structured embodiment, it is possible to form the contact portions 11d and 11e of contact pin 11 to be much closer to each other than the previous embodiments. Also, it is possible to shorten a current-carrying path between the terminal 15a of IC 15 and the wiring 21, which is generated in the contact pin 11. Therefore, in the IC socket 1 of this embodiment, the inductance components can be further reduced as compared with the previous embodiments.

The contact pin 11 is formed to have a space between the hole 34 and the contact pin support member 35 under the state of FIG. 6. For this reason, if the contact pin 11 is pressed by the actuating portion 17 of press lever 3, the contact pin 11 deforms the rubber 17 elastically so as to be slide in the right direction in this figure. As a result, the natural oxide films, which cover the surface of the terminal 15a of IC 15 and that of the wiring 21, are peeled out by the contact portions 11d and 11e.

(Fifth Embodiment)

Figure 7:
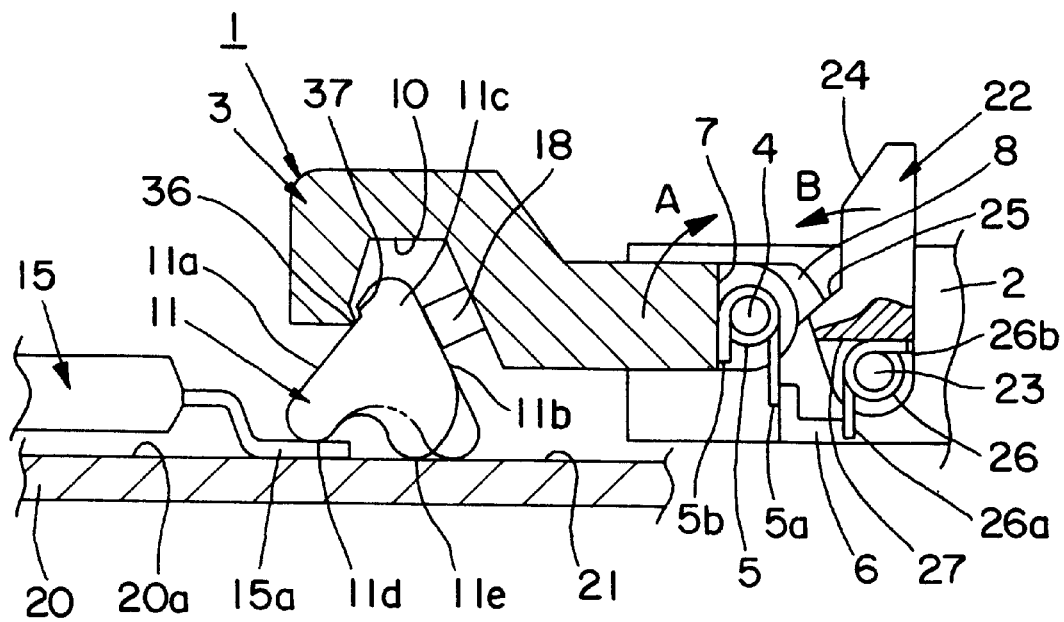
FIG. 7 is a cross sectional view showing main parts of an IC socket according to a fifth embodiment of the present invention.

FIG. 7 shows the IC socket 1 according to a fifth embodiment of the present invention. The same reference numerals as those of the first embodiment are added to the structure common to the first embodiment, and the explanation thereof will be given as omitting the explanation overlapping with the first embodiment.

In the IC socket 1 of this embodiment, an actuating portion 36, which presses the first inclined side 11a of contact pin 11, is formed on the press lever 3 to be projected therefrom. On the other hand, a step portion 37, which is engaged with this actuating portion 36, is formed at the upper portion of the first inclined side 11a of contact pin 11 such that the second inclined side 11b of contact pin 11 is pressed by the rubber 18. The contact pin 11 is hooked on the actuating portion 36 so that the contact pin 11 is rotated around the shaft 4 together with the press lever 3.

In the above-structured IC socket 1, if the first inclined side 11a of contact pin 11 is pressed by the actuation 36 of press lever 3, the second inclined side 11b of contact pin 11 presses and shrinks the rubber 18, and moves in the right direction in the figure so as to peel out the natural oxide films, which cover the surface of the terminal 15a of IC 15 and that of the wiring 21 of the substrate 20, Therefore, the terminal 15a of IC 15 and the wiring 21 can be electrically connected to each other without fail through the contact pin 11.

Also, in the IC socket 1 of this embodiment, the actuating portion 36 also serves as a function of the contact pin support member 13 of the first embodiment. This eliminates the need for providing the contact pin support member 13 in the vicinity of the contact portions 11d and 11e (FIG. 1). Also, the contact portion 11d on the terminal 15a side of IC 15 and the contact portion 11e on the wiring 21 side of the substrate 20 can be formed to be much closer to each other than the case (two-dotted chain line) of the first embodiment, and the connection path between the terminal 15a of IC 15 and the wiring 21, which is generated in the contact pin 11, can be shortened. As a result, in the IC socket 1 of this embodiment, the inductance components can be further reduced as compared with the first embodiment, and the high frequency characteristic of IC 15 can be measured with much higher accuracy.

(Sixth Embodiment)

Figure 8:
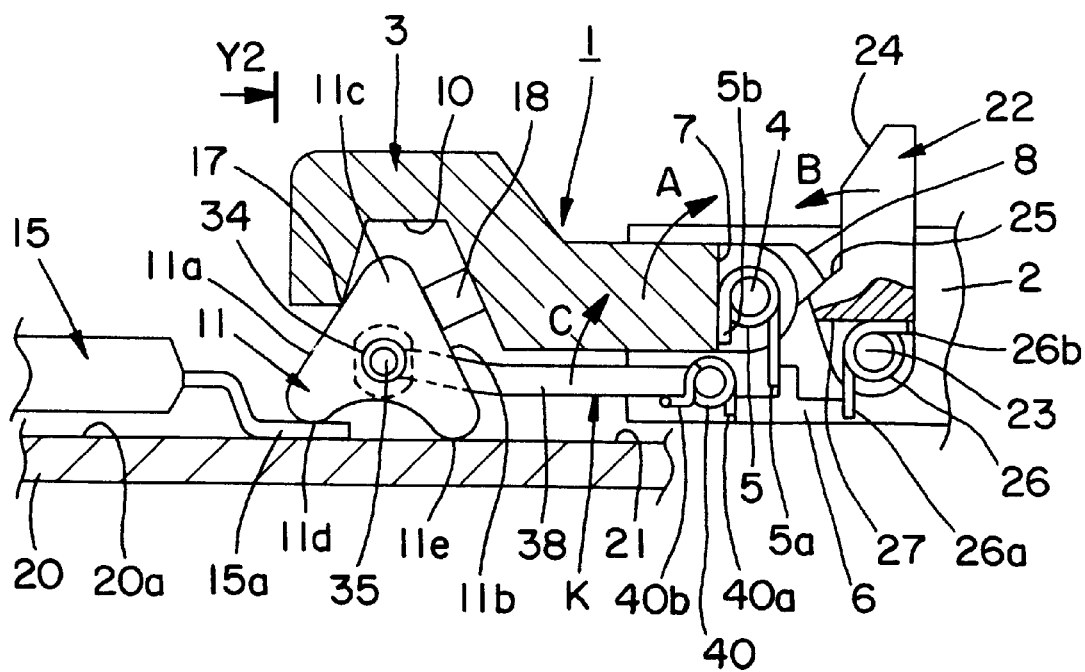
FIG. 8 is a cross sectional view showing main parts of an IC socket according to a sixth embodiment of the present invention.
Figure 10:
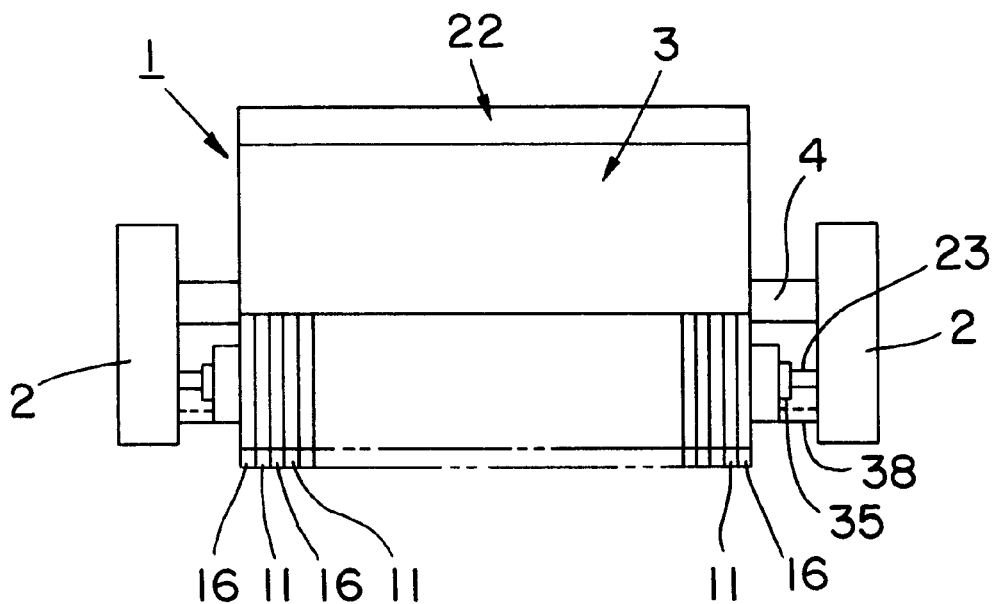
FIG. 10 is a left side view (view in a direction of Y2) of the IC socket of FIG. 8.

FIGS. 8 and 10 show the IC socket 1 according to a sixth embodiment of the present invention. The same reference numerals as those of the first embodiment are added to the structure common to the first embodiment, and the explanation thereof will be given as omitting the explanation overlapping with the first embodiment.

In the IC socket 1 according to this embodiment, a contact pin support arm 38 is rotatably attached to the socket main body. The contact pin support 38 is always urged clockwise (direction C) in FIG. 8 by a spring 40. Then, the contact pin support member 35 is attached to the tip of this contact pin support arm 38 to be fitted to the hole 34 such that a space is generated between the hole 34 of the contact pin 11 and the contact pin support member 35. One end 40a of the spring 40 comes in contact with the spring support portion 6 formed in the socket main body 6, and other end 40b comes in contact with the contact pin support arm 38. As shown in FIG. 10, the plurality of contact pins 11 are alternately engaged with the contact pin support member 35 and the insulating member 16. Also, the contact pin support arm 38, spring 40, contact pin support member 35 constitutes elastic support means K for pressing the contact pin 11 to the actuating portion 17 and rubber 18.

Under the state of FIG. 8, if the first inclined side 11a of contact pin 11 is pressed by the actuating portion 17, the contact pin 11 moves in the right direction in the figure as changing the contact position between the hole 34 and the contact pin support member 35 and as deforming the rubber 18 elastically. As a result, the contact pin 11 can peel out the natural oxide films, which covers the terminal 15a of IC 15 and the wiring 21, and the same effect as that of the first embodiment can be obtained.

The contact pin 11 is structured to be pressed to the press lever 3 by the contact pin support arm 38, which has been urged clockwise in FIG. 8 by the spring 40. For this reason, if the press lever 3 rotates clockwise in the figure, the contact pin 11 rotates together with the press lever 3.

The above-structured embodiment can obtain the same effect as that of the first embodiment.

Figure 13:
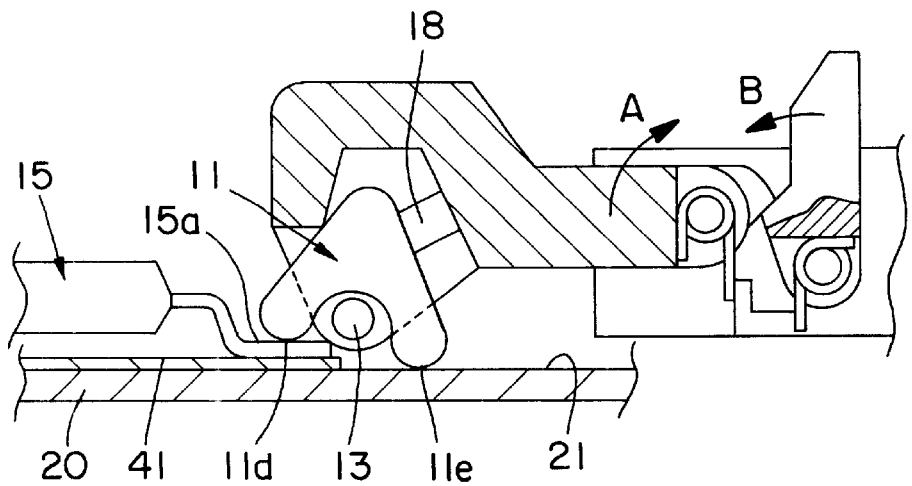
FIG. 13 is a cross sectional view of main parts of the IC socket showing a first application example of the present invention.
Figure 14:
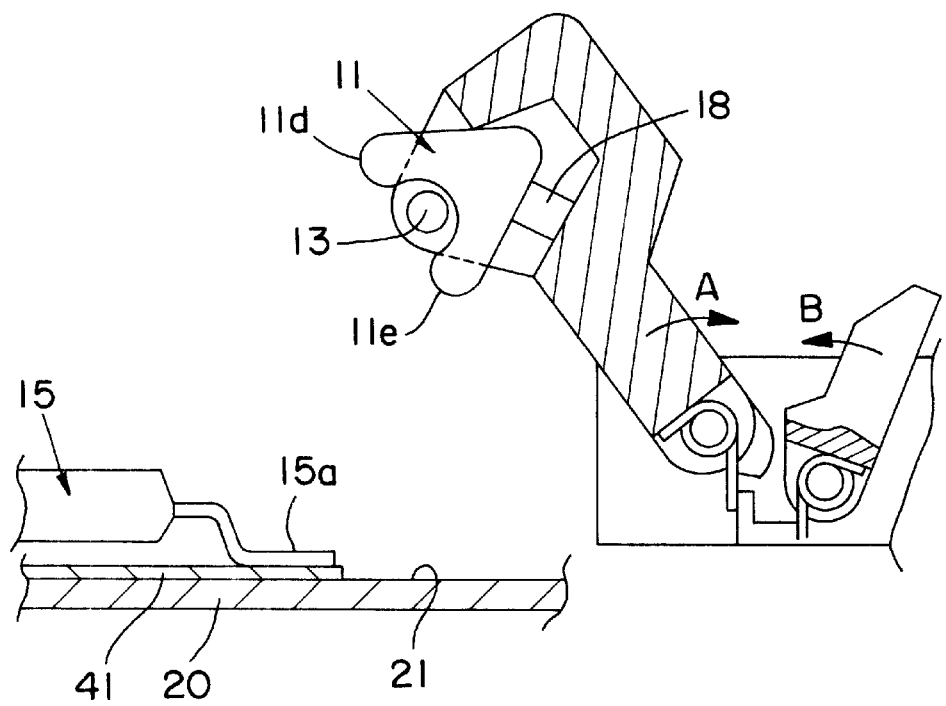
FIG. 14 is a view showing an actuation state of the IC socket of FIG. 13.

The above embodiment showed the specific form in which the IC 15 was mounted on the IC support portion 20a of the substrate 20. The present invention is not limited to this specific form. As shown in FIGS. 13 and 14, the IC 15 may be mounted on a spacer (IC support portion) 41 set on the substrate 20. The change in the attitude of contact pin 11 can be absorbed by the space between the contact pin 11 and the contact pin support member 13 and the deformation of rubber 18 by this way. For this reason, the contact portions 11d and 11e of contact pin 11 come in contact with the terminal 15a of IC 15 and the wiring 21 of the substrate 20 without fail.

Figure 15:
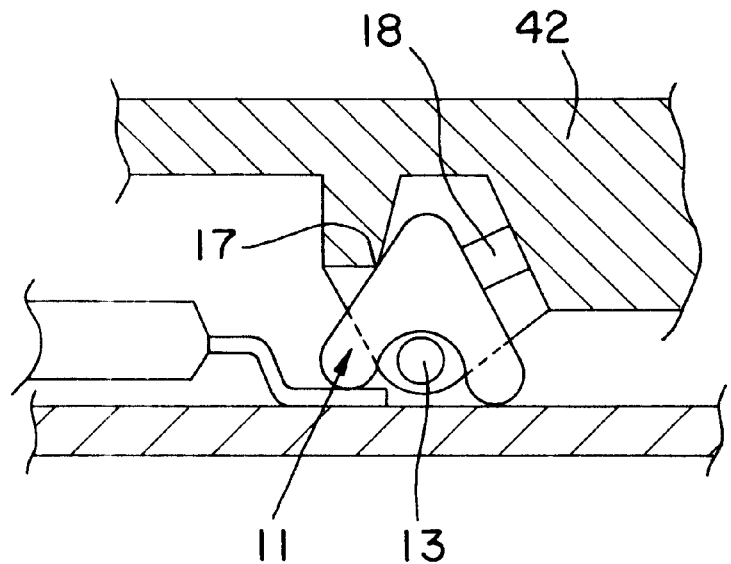
FIG. 15 is a cross sectional view of main parts of the IC socket showing a second application example of the present invention.
Figure 16:
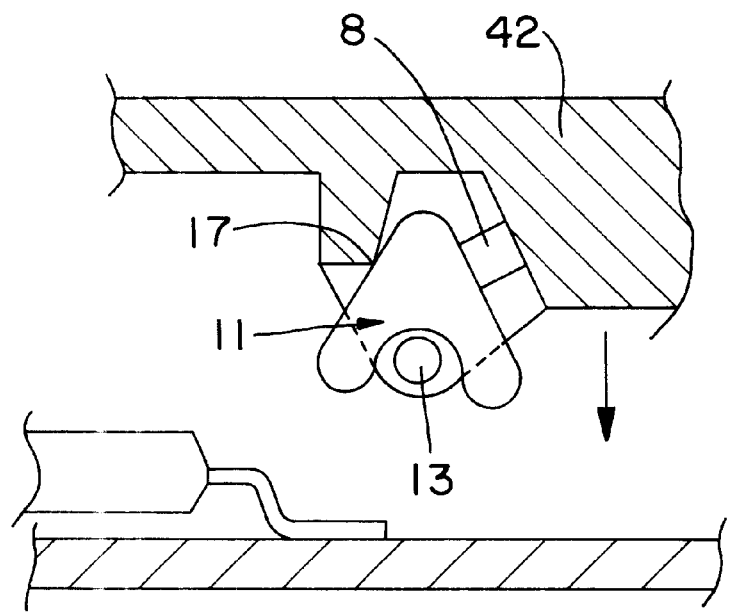
FIG. 16 is a view showing an actuation state of the IC socket of FIG. 15.
Figure 17:
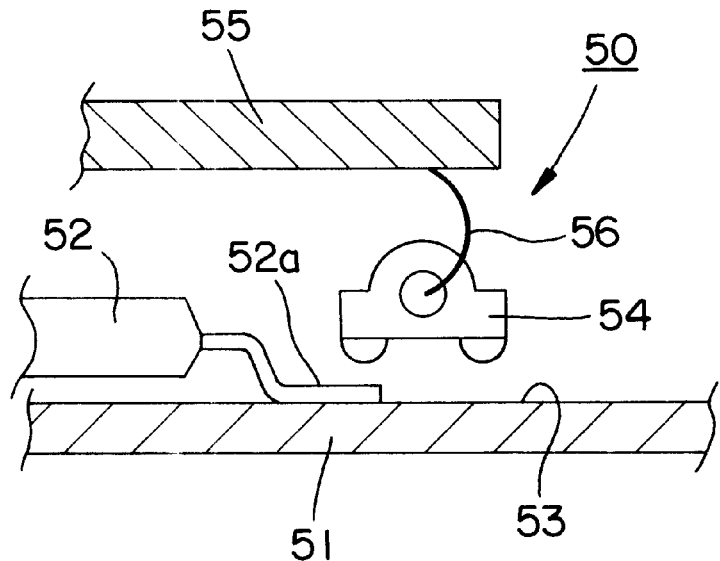
FIG. 17 is a cross sectional view of main parts of an IC socket showing a first prior art.
Figure 18:
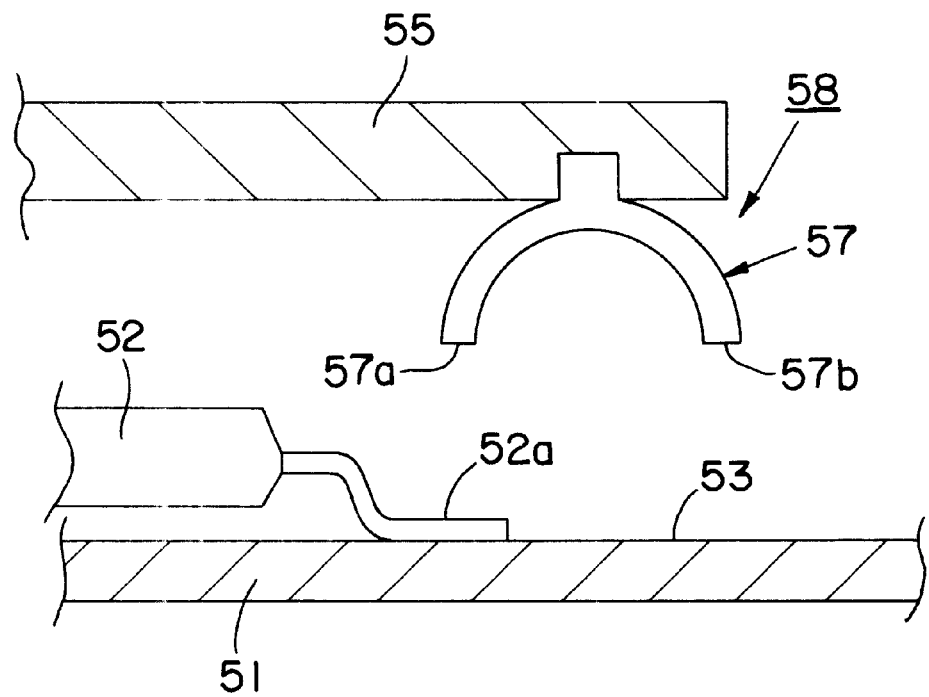
FIG. 18 is a cross sectional view of main parts of an IC socket showing a second prior art.

The above embodiment showed the specific form in which the contact pin 11 was pressed by the press lever 3 rotatably attached to the socket main body 2. However, as shown in FIGS. 15 to 16, the actuating portion 17 is formed on a cover 42, which moves up and down, and the rubber 18 is attached thereto, and the contact pin 11 may be supported by the contact pin support member 13 attached to the cover 42. The same effect as that of the first embodiment can be obtained by this way.

(Seventh Embodiment)

Figure 12:
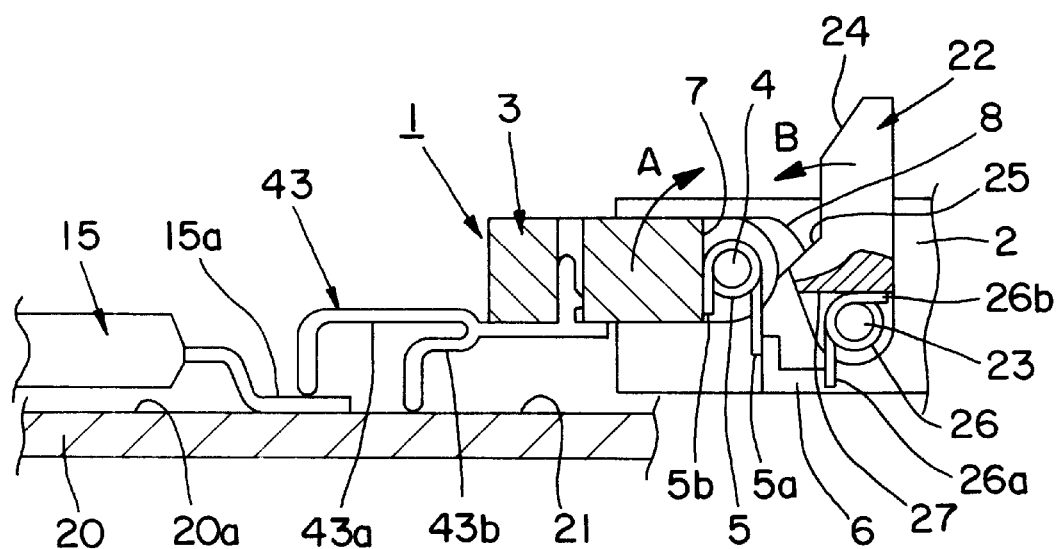
FIG. 12 is a cross sectional view showing main parts of an IC socket according to a seventh embodiment of the present invention.

FIG. 12 shows the IC socket 1 according to a seventh embodiment of the present invention. The same reference numerals as those of the first embodiment are added to the structure common to the first embodiment, and the explanation thereof will be given as omitting the explanation overlapping with the first embodiment.

In the IC socket 1 of this embodiment, a contact pin 43 is attached to the tip of the press lever 3 in a one-side beam form. Then, the contact pin 43 comprises a first contact portion 43a, which comes in contact with the terminal 15a of IC 15, a second contact portion 43b, which comes in contact with the wiring 21 of substrate 20. These first and second contact portions 43a and 43b are structured to be elastically deformed.

In the above-structured IC socket 1, if the contact pin 43 is pressed to the terminal 15a of IC 15 and the wiring 21 of substrate 20 by the press lever 3, the first contact portion 43a are elastically deformed to rub the surface of the terminal 15a of IC 15, and the first contact portion 43b is elastically deformed to rub the surface of the wiring 21 of substrate 20. As a result, the natural oxide films, which cover the surface of the terminal 15a and that of the wiring 21, are peeled out by the first and second contact portions 43a and 43b.

Therefore, in the IC socket 1 of this embodiment, the terminal 15a of IC 15 and the wiring 21 of substrate 20 can be electrically connected to each other through the contact pin 43 without fail, allowing the electrical test of IC 15 to be correctly performed.

In the above-explained embodiments, if the press lever 3, operation lever 22 and cover 42 are operated by robot arms for carrying IC or a handling apparatus, the electrical test of IC 15 can be automatically carried out without depending on manpower.

What is claimed is:

1. An IC socket comprising:
   a contact pin having contact portions on one side thereof, said contact portions coming in contact with a terminal of an IC mounted on an IC support portion and a wiring formed on a substrate in such a manner that said contact pin mounts over said terminal and said wiring on said one side, so as to electrically connect said terminal of IC to said wiring; and
   a press member for pressing said contact pin to said terminal and said wiring on said one side,
   wherein said contact pin has a first inclined side and a second inclined side crossing each other to define said one side therebetween, said press member has an actuating portion contacting with said first inclined side and an elastic member contacting with said second inclined side, and said contact pin is supported by a contact pin support member attached to said press member such that when said contact pin is pressed onto said terminal and said wiring by said actuating portion contacting with said first inclined side, said contact pin deforms said elastic member contacting with said second inclined side by an inclined surface component force applied to said first inclined side by said actuating portion so that said contact portions slide on said terminal and said wiring.

2. The IC socket according to claim 1, wherein said elastic member is a metal-made elastic member, which is attached to said press member in a one-side beam form, and an insulating member is fixed to a contact portion of said metal-made elastic member with said contact pin.

3. The IC socket according to claim 1, wherein said contact pin support member is engaged with an engaging portion of said contact pin, said engaging portion formed at a lower side of said contact pin between said contact portions.

4. The IC socket according to claim 1, wherein said contact pin support member is fitted to a hole, which is formed on said contact pin, to generate a space.

5. An IC socket comprising:
   a contact pin having contact portions on one side thereof, said contact portions coming in contact with a terminal of an IC mounted on an IC support portion and a wiring formed on a substrate in such a manner that said contact pin mounts over said terminal and said wiring on said one side, so as to electrically connect said terminal of IC to said wiring; and
   a press member for pressing said contact pin to said terminal and said wiring on said one side,
   wherein said contact pin has a first inclined side and a second inclined side crossing each other to define said one side therebetween, said press member has an actuating portion contacting with said first inclined side and an elastic member contacting with said second inclined side, and said contact pin has a step portion on said first inclined side, which is supported by the actuating portion of said press member, such that when said contact pin is pressed onto said terminal and said wiring by said actuating portion contacting with said first inclined side, said contact pin deforms said elastic member contacting with said second inclined side by an inclined surface component force applied to said first inclined side by said actuating portion so that said contact portions slide on said terminal and said wiring.

6. An IC socket comprising:
   a contact pin having contact portions on one side thereof, said contact portions coming in contact with a terminal of an IC mounted on an IC support portion and a wiring formed on a substrate in such a manner that said contact pin mounts over said terminal and said wiring on said one side, so as to electrically connect said terminal of IC to said writing; and
   a press member for pressing said contact pin to said terminal and said wiring on said one side,
   wherein said contact pin has a first inclined side and a second inclined side crossing each other to define said one side therebetween, said press member has an actuating portion contacting with said first inclined side and an elastic member contacting with said second inclined side, and said contact pin is urged to said actuating portion and said elastic member by elastic support means, which is attached to a socket main body, such that when said contact pin is pressed onto said terminal and said wiring by said actuating portion contacting with said first inclined side, said contact pin deforms said elastic member contacting with said second inclined side by an inclined surface component force applied to said first inclined side by said actuating portion so that said contact portions slide on said terminal and said wiring.

7. An IC socket comprising:
   a contact pin, which has contact portions coming in contact with a terminal of an IC mounted on an IC support portion and a wiring formed on a substrate in such a manner that said contact pin mounts over said terminal and said wiring, and which electrically connects said terminal of IC to said wiring;
   a press lever for pressing said contact pin to said terminal and said wiring;
   an operation lever for locking said press lever at a predetermined position where said contact pin comes in contact with said terminal and said wiring;
   a socket main body for rotatably supporting said press lever and said operation lever;
   a first spring for constantly urging said press lever in a rotational direction where a contact state among said contact pin, said terminal and said wiring is released; and a second spring for constantly urging said operation lever in a rotational direction, which is opposite to the urging direction of said first spring, wherein a first cam is formed at said press lever, while a second cam, which opposes said first cam, is formed at said operation lever, and when said press lever is rotated to a predetermined position where said contact pin is pressed, said first cam and said second cam are meshed with each other by spring force of said first spring and said second spring so that said press lever is locked by said operation lever, and when said operation lever is rotated in a direction, which is opposite to the urging direction of said second spring, the mesh between said first cam and said second cam is released, and said press lever is rotated in a direction where said press lever separates from said predetermined position, by said first in spring.

* * * * *